United States Patent
Casper et al.

(10) Patent No.: US 6,507,074 B2
(45) Date of Patent: Jan. 14, 2003

(54) STRUCTURE FOR ESD PROTECTION IN SEMICONDUCTOR CHIPS

(75) Inventors: Stephen L. Casper, Boise, ID (US); Manny K. F. Ma, Boise, ID (US); Joseph C. Sher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/945,513

(22) Filed: Aug. 30, 2001

(65) Prior Publication Data
US 2002/0047165 A1 Apr. 25, 2002

Related U.S. Application Data

(62) Division of application No. 09/097,481, filed on Jun. 15, 1998, which is a continuation of application No. 08/869,513, filed on Jun. 5, 1997, now Pat. No. 5,767,552, which is a continuation of application No. 08/565,421, filed on Nov. 30, 1995, now abandoned.

(51) Int. Cl.$^7$ .............................................. H01L 23/62
(52) U.S. Cl. ...................................... 257/356; 257/357
(58) Field of Search ................................ 257/356, 357, 257/355

(56) References Cited

U.S. PATENT DOCUMENTS

| | | | |
|---|---|---|---|
| 4,691,217 A | 9/1987 | Ueno et al. | 357/23.13 |
| 4,822,749 A | 4/1989 | Flanner et al. | 437/41 |
| 4,977,537 A | 12/1990 | Dias et al. | 364/900 |
| 5,017,985 A | * 5/1991 | Lin | |
| 5,051,860 A | 9/1991 | Lee et al. | 361/58 |
| 5,066,999 A | 11/1991 | Casper | 357/51 |
| 5,079,441 A | * 1/1992 | Scott | |
| 5,148,056 A | 9/1992 | Glass et al. | 307/443 |
| 5,227,327 A | 7/1993 | Sasaki | 437/60 |
| 5,274,276 A | 12/1993 | Casper et al. | 307/443 |
| 5,304,502 A | 4/1994 | Hanagasaki | 437/41 |
| 5,440,163 A | 8/1995 | Ohhashi | 257/355 |
| 5,565,698 A | 10/1996 | Obermeier | 257/360 |
| 5,618,740 A | 4/1997 | Huang | 438/224 |
| 5,654,860 A | 8/1997 | Casper et al. | 361/91 |
| 5,760,446 A | * 6/1998 | Yang et al. | |
| 5,880,917 A | 3/1999 | Casper et al. | 361/56 |
| 5,910,673 A | * 6/1999 | Hsu et al. | |
| 5,929,493 A | 7/1999 | Wu | 257/369 |
| 5,945,714 A | * 8/1999 | Yu | |
| 5,985,722 A | 11/1999 | Kishi | 438/275 |
| 6,004,838 A | 12/1999 | Ma et al. | 438/200 |
| 6,140,189 A | * 10/2000 | Hsu et al. | |

FOREIGN PATENT DOCUMENTS

| | | | |
|---|---|---|---|
| EP | 0246139 | 11/1987 | |
| EP | 0654830 | 5/1995 | |
| GB | 2281813 | 3/1995 | |
| JP | 9036357 | 2/1997 | ........... H01L/29/78 |

OTHER PUBLICATIONS

Winnerl, J., "Silicides for High–Density Memory and Logic Circuits", Semiconductor International, (4 pages) (Aug. 1994).

* cited by examiner

*Primary Examiner*—Stephen D. Meier
(74) *Attorney, Agent, or Firm*—Schwegman, Lundberg, Woessner & Kluth, P.A.

(57) ABSTRACT

An ESD protection structure for I/O pads is formed with well resistors underlying the active areas of a transistor The well resistors are coupled in series with the active areas and provide additional resistance which is effective in protecting the transistor from ESD events. Metal conductors over the active areas, have a plurality of contacts to the active areas formed through an insulative layer to contact the active areas. Additional active areas adjacent to the active areas of the transistor are also coupled to the well resistors, and to a conductive layer which provides a conductor to the I/O pads. The active areas are silicided to reduce their resistance and increase the switching speed of the transistor. The n-well resistors are coupled in series to provide a large resistance with respect to that of the active areas to reduce the impact of ESD events.

28 Claims, 1 Drawing Sheet

STRUCTURE FOR ESD PROTECTION IN SEMICONDUCTOR CHIPS

This application is a Divisional of U.S. application Ser. No. 09/097,481, filed Jun. 15, 1998, which is a Continuation of U.S. application Ser. No. 08/869,513, filed Jun. 5, 1997, now U.S. Pat. No. 5,767,552, which is a File-Wrapper Continuation of U.S. application Ser. No. 08/565,421, filed Nov. 30, 1995, now abandoned.

REFERENCE TO RELATED APPLICATIONS

Reference is made to ceding application Ser. No. 08/515,921, tided. "Well Resistor for ESD Protection of CMOS Circuits" filed Aug. 16, 1995 and assigned to the same assignee as the present invention, and which is hereby incorporated by reference.

FIELD OF THE INVENTION

The present invention relates to a semiconductor structure for shunting current during an electrostatic discharge event in a semiconductor chip, and in particular to the use of well resistors to increase the resistance of the structure.

BACKGROUND OF THE INVENTION

In conventional CMOS processes, built-in resistors from the active areas of a transistor protect transistors designed to shunt current by absorbing a portion of voltage drops, and also serve to limit the total amount of current that is allowed to flow during electrostatic discharge (ESD) events. ESD transistors are used to provide a known current path to discharge the current associated with ESD events. However, in processes where the resistance of the active areas of transistors is small, or is reduced to improve the frequency response of CMOS circuitry, the active area resistance no longer functions to provide such a current limiting effect through the ESD transistor. A need exists to add back in resistance to limit the current through ESD transistors during ESD events to prevent damage to such transistors and other semiconductor structures.

SUMMARY OF THE INVENTION

The present invention provides an apparatus for limiting the amount of current flowing through ESD transistor during an ESD event. Well resistors are coupled in series with the active areas of a field effect transit and conductors used to transport signals to and from a die.

In one embodiment of the present invention, an ESD transistor has n-well resistors formed beneath its n+ active areas. N+ active areas are further formed adjacent to each of the ESD transistor active areas, with the well resistor extending under at least a portion of such adjacent n+ areas. The n-well resistors and n+ areas are coupled electrically in series, so that current flowing through the ESD transistor also encounters the resistance of the n-well resistor which has a much higher sheet resistance than the n+ active areas. In one embodiment the sheet resistance of the n-well resistors is many tiles greater than that of the n+ active areas because the n+ active areas are covered with a silicide formed with tungsten or titanium to reduce the overall resistance of tie n+ active areas, which results in faster switching times for the transistor. Metal conductors are formed over the adjacent n+ areas, and are separated therefrom by an insulative layer formed of silicon dioxide, BPSG or other suitable insulator.

The metal conductors serve as conductors to the I/O pads and to the power supply, and have a plurality of contacts formed therethrough extending down into electrical contact with the n+ active areas. Further sets of contacts are formed in the ESD transistor n+ active areas. A metal layer is also formed on top of each set of the contacts for connection to other circuitry.

The n-well resistors provide large voltage drops during high currents, limiting both voltage and current experienced by the ESD transistor. Thus the adverse impact of ESD events is limited

DESCRIPTION OF THE EMBODIMENTS

Figure 1:
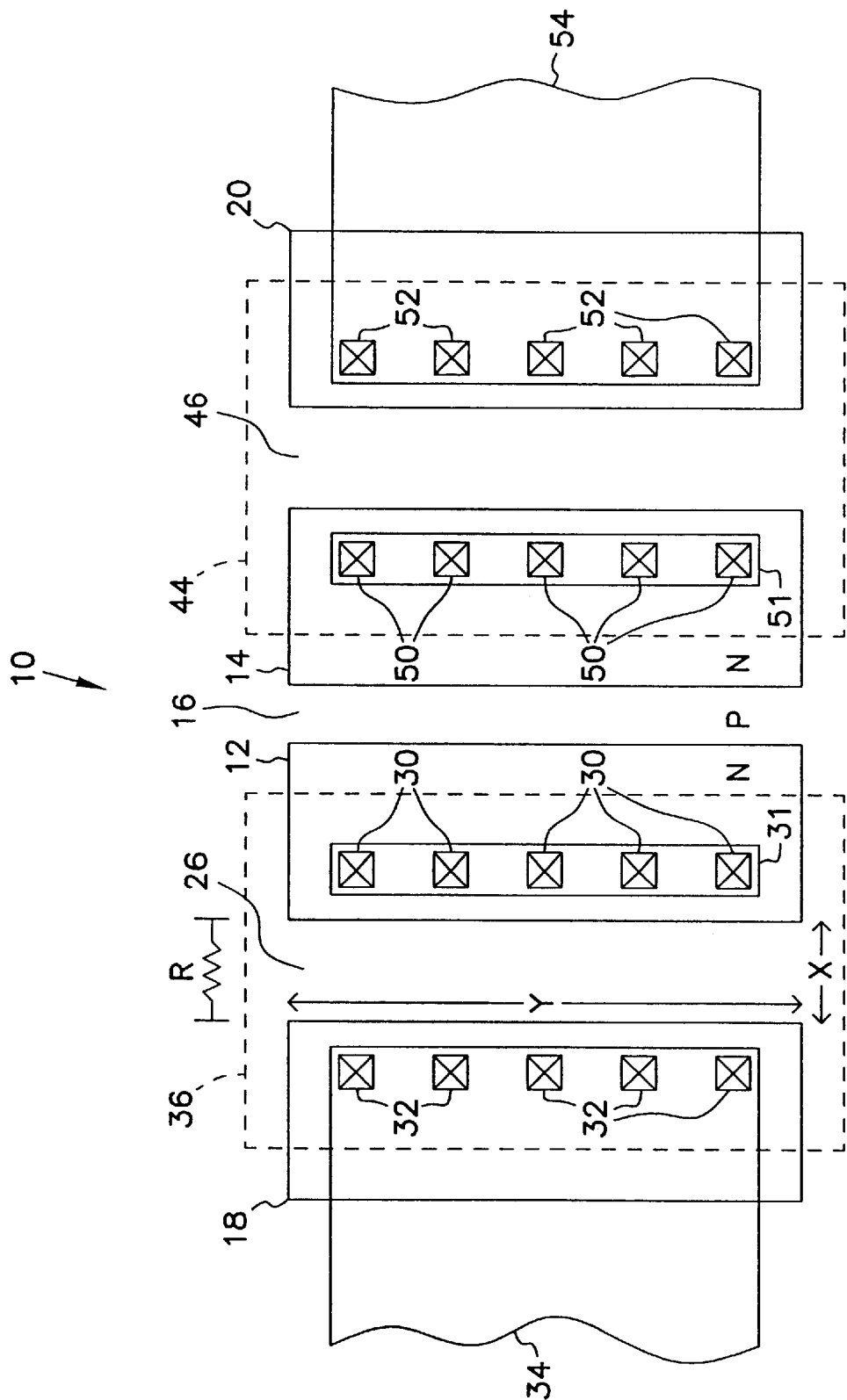
FIG. 1 is a planar view of a portion of a semiconductor die having an ESD protection structure formed therein.

In the following detailed description of the embodiments, reference is made to the accompanying drawing which forms a part hereof and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

In FIG. 1, a planar view of an electrostatic discharge protection structure or circuit formed in a p-doped area of a semiconductor die is shown generally at 10. The circuit comprises a pair of adjacently spaced first n+ doped polysilicon active areas 12 and 14 which may be used as a source and drain for a CMOS bipolar lateral npn structure. The gap between the source and drain indicated at 16 is p-doped. Any type of transistor structure that provides a known current path during an ESD event may be used. A pair of second n+ active areas 18 and 20 are formed adjacent and spaced apart, as indicated at 26 and 46, from the active areas 12 and 14 and the entire structure is covered with a deposited or grown insulative material such as silicon dioxide, BPSG or other suitable insulative material. The spacing of the active areas is sufficient to inhibit current flow directly between the active areas.

A first plurality of contacts 30 formed of metal or highly conductive polysilicon are formed through the insulative layer into the active area 12 to conduct electricity therebetween. They are electrically coupled together by a highly conductive layer 31 to provide a more uniform current flow through the contacts. Similarly, a second plurality of contacts 32 are formed through the insulative layer to contact the adjacent active area 18. Contacts 32 are also electrically coupled via a highly conductive layer such as a metalized conductor 34 which is used as a conductor to the power supply. A n-well resistor 36 is formed at least partially beneath both active area 12 and adjacent active area 18 and is in electrical contact with both by virtue of being physically coupled. In one embodiment, the n-well is formed to extend beneath both the first and second sets of contacts 30 and 32. The n-well resistor is formed using standard ion implantation techniques or other well known techniques. It has a sheet resistance in the range of about 2000 ohms per square in one embodiment. The resistance in other embodiments may be varied depending on the total resistance desired. The resistance is designed to be much greater than the resistance provided by the active n+ areas, which have a much lower sheet resistance to maintain high frequency switching capability. The total resistance provided by each n-well resistor is a function of the length, x, between the n+ active areas, and the width, y. The ratio x/y times the sheet resistance provides the total resistance.

A third plurality of contacts 50 formed of metal or highly conductive polysilicon are formed through the insulative layer into the active area 14 to conduct electricity therebetween. They are connected together by a highly conductive layer 51 which facilitates contact with further circuitry which is not shown. Similarly, a fourth plurality of contacts 52 are formed through the insulative layer to contact the adjacent active area 20. A conductor 54 is formed to provide electrical connection to the contacts 52 and provides a conductor for attachment to conductive input and/or output pads which are not shown. The contacts may be any type of contact that provides an electrically conductive path between the two conductive layers. Metal through holes, vias of heavily doped polysilicon or similar structures may be used. The contacts and conductive layers are formed using standard processes of photomasking techniques followed by deposition, diffusion or implantation of desired substances. The conductors are usually formed during the same steps, and are formed of a metalized layer as is commonly used for other conductors. A second n-well resistor 44 is formed at the same tie as the first n-well resistor 36 at least partially beneath both active area 14 and adjacent active area 20 and is in electrical contact with both. It also provides a resistance which is a function of the length and width of the gap between active n+ areas.

In one embodiment, silicide, preferably formed with tungsten (TuSi2), titanium (TiSi2) or other suitable metal, is applied to the surface of the active N+ areas 12, 14, 18 and 20 to decrease their resistance and increase the switching speed of circuitry formed by such active areas. The sheet resistance of the silicide is preferably around 5 or 6 ohms per square but may vary with different materials and concentrations. In many prior transistors, the active area resistance served to limit the current through the transistor during an ESD event. Since the resistance of the active areas is now decreased by the silicide, they no longer serve well for that function. The much higher resistance of the n-well resistors provides much better protection from ESD events.

Each n+ active area has a low resistance, while the n-well resistors have a much greater resistance of R as indicated in FIG. 1. As can be seen, active area 12 is coupled in series to well resistor 36, and adjacent active area 18, providing a total resistance of approximately R. In addition, active area 14 is coupled in series to well resistor 44 and active area 20, providing a total resistance of approximately R. Since R is much greater than n+ active area resistances, the total resistance provided by the ESD protection circuit is approximately 2×R. This is much greater than that provided by a normal silicided ESD transistor. It serves well to limit the current flowing through the ESD transistor and I/O pads, preventing failures from excess current flow.

It should be noted that in many field effect transistors, the source and drain are essentially interchangeable, and interconnections specified herein should not be interpreted as solely limited to those described. In addition, while the ESD structure was described as a lateral npn structure, it is recognized by those skilled in the art that a lateral pnp structure may also be used if the structures are uniformly oppositely doped from that described. The n and p designations are used in the common manner to designate donor and acceptor type impurities which promote electron and hole type carriers respectively as the majority carriers. The "+" symbol, when used as a suffix with an impurity type shall be interpreted to mean that the doping concentration of that impurity is heavier than the doping associated with just the letter identifying the impurity type without the "+" suffix. It should also be noted that silicon is one preferred semiconductor material, but other semiconductor materials such as germanium, diamond, and gallium arsenide to name a few may also be used.

The above description is intended to be illustrative, and not restrictive. Many other embodiment will be apparent to those of skill in the art upon reviewing the above description. The scope of the invention should, therefore, be determined with reference to the appended claims along with the full scope of equivalents to which such claims are entitled.

What is claimed is:

1. An ESD protection device for semiconductor circuitry in a semiconductor substrate, comprising:
    first and second heavily doped active areas formed in the substrate as a source and a drain of a lateral CMOS transistor;
    a third heavily doped area formed in the substrate and separated from the first active area;
    a first well resistor between and at least partially under the first active area and the heavily doped third area and conductively coupled thereto, the first well resistor having a higher sheet resistance than the first active area and the third area;
    a first conductive layer disposed over the third area and electrically coupled thereto;
    a fourth heavily doped area formed in the substrate and separated from the second active area;
    a second well resistor formed in the substrate between and at least partially under the second active area and the fourth heavily doped area and conductively coupled thereto, the second well resistor having a higher sheet resistance than the second active area and the fourth area and disposed substantially in a straight line with the first well resistor;
    a second conductive layer disposed over the fourth area and conductively coupled thereto;
    a third conductive layer disposed over the fourth area and conductively coupled thereto;
    a first insulative layer disposed between the third heavily doped area and the first conductive layer; and
    a first plurality of contacts electrically connecting the first conductive layer to the third area,
        wherein the first and second active areas are covered with a silicide.

2. The ESD protection structure of claim 1 wherein the silicide comprises tungsten.

3. The ESD protection structure of claim 1 wherein the silicide comprises titanium.

4. The ESD protection structure of claim 1 wherein the well resistor is doped with p type donor impurities.

5. The ESD protection structure of claim 1 wherein the well resistors are doped with n type donor impurities.

6. The ESD protection structure of claim 2 wherein the first insulative layer is silicon dioxide.

7. The ESD protection structure of claim 1 and further comprising:
    a second insulative layer disposed between the first heavily doped active area and the first conductive layer; and
    a second plurality of contacts electrically coupling said second conductive layer to the first heavily doped active area.

8. An ESD protection structure formed in a semiconductor substrate, the structure comprising:
- a lateral CMOS transistor having a source and a drain comprising first and second heavily doped active areas;
- a third heavily doped area separated from the first area of the transistor;
- a first well resistor formed between and at least partially under the first active area and the heavily doped third area and conductively coupled thereto, the first well resistor having a higher sheet resistance than the first area and the third area;
- a first conductive layer disposed over the third area and electrically coupled thereto;
- a fourth heavily doped area separated from the second active area;
- a second well resistor formed between and at least partially under the second active area and the fourth heavily doped area and conductively coupled thereto, the second well resistor having a higher sheet resistance than the second area and the fourth area; and
- a second conductive layer disposed over the fourth area and conductively coupled thereto.

9. The ESD protection structure of claim 8, further comprising:
- a first insulative layer disposed between the third heavily doped area and the first conductive layer; and
- a first plurality of contacts electrically connecting the first conductive layer to the third area.

10. The ESD protection structure of claim 9, further comprising:
- a second insulative layer disposed between the fourth heavily doped area and the second conductive layer; and
- a second set of contacts electrically connecting the second conductive layer to the fourth area.

11. The ESD protection structure of claim 9, further comprising:
- a third conductive layer disposed over the first active area;
- a third insulative layer disposed between the first area and the first conductive layer; and
- a third set of contacts electrically coupling the third conductive layer to the first area.

12. The ESD protection structure of claim 11, further comprising:
- a fourth conductive layer disposed over the second active area;
- a fourth insulative layer disposed between the second area and the second conductive layer; and
- a fourth set of contacts electrically coupling the fourth conductive layer to the second area.

13. The ESD protection structure of claim 8, wherein the first well resistor is doped with N type impurities.

14. The ESD protection structure of claim 13, wherein the second well resistor is doped with P type impurities.

15. An ESD protection structure formed in a semiconductor substrate, the structure comprising:
- a lateral CMOS transistor having a source and a drain comprising first and second heavily doped active areas;
- a third heavily doped area separated from the first area of the transistor;
- a first well resistor formed between and at least partially under the first active area and the heavily doped third area and conductively coupled thereto, the first well resistor having a higher sheet resistance than the first area and the third area;
- a first conductive layer disposed over the third area and electrically coupled thereto;
- a fourth heavily doped area separated from the second active area;
- a second well resistor formed between and at least partially under the second active area and the fourth heavily doped area and conductively coupled thereto, the second well resistor having a higher sheet resistance than the second area and the fourth area; and
- a second conductive layer disposed over the fourth area and conductively coupled thereto,
  - wherein the second well resistor is disposed substantially in a straight line with the first well resistor.

16. The ESD protection structure of claim 15, wherein the transistor is also disposed substantially in the straight line.

17. An ESD protection device in a semiconductor substrate, comprising:
- first and second heavily doped active areas as a source and a drain of a lateral CMOS transistor;
- a third heavily doped area separated from the first active area;
- a first well resistor between and at least partially under the first active area and the heavily doped third area and conductively coupled thereto, the first well resistor having a higher sheet resistance than the first active area and the third area;
- a first conductive layer disposed over the third area and electrically coupled thereto;
- a fourth heavily doped area separated from the second active area;
- a second well resistor formed between and at least partially under the second active area and the fourth heavily doped area and conductively coupled thereto, the second well resistor having a higher sheet resistance than the second active area and the fourth area; and
- a second conductive layer disposed over the fourth area and conductively coupled thereto,
  - wherein the first and second active areas and the third and fourth heavily doped areas are silicided so as to lower their resistance by a substantial factor.

18. The ESD protection structure of claim 17 wherein the well resistors are doped with n type donor impurities.

19. The ESD protection structure of claim 17 wherein the well resistors are doped with p type donor impurities.

20. An ESD protection device in a semiconductor substrate, comprising:
- first and second heavily doped active areas as a source and a drain of a lateral CMOS transistor;
- a third heavily doped area separated from the first active area;
- a first well resistor between and at least partially under the first active area and the heavily doped third area and conductively coupled thereto, the first well resistor having a higher sheet resistance than the first active area and the third area;
- a first conductive layer disposed over the third area and electrically coupled thereto;
- a fourth heavily doped area separated from the second active area;
- a second well resistor formed between and at least partially under the second active area and the fourth heavily doped area and conductively coupled thereto, the second well resistor having a higher sheet resistance than the second active area and the fourth area;

a second conductive layer disposed over the fourth area and conductively coupled thereto;

a first insulative layer disposed between the third heavily doped area and the first conductive layer; and a first set of contacts electrically connecting the first conductive layer to the third area.

21. The ESD protection structure of claim 20 wherein the well resistors are doped with n type donor impurities.

22. The ESD protection structure of claim 20 wherein the well resistors are doped with p type donor impurities.

23. An ESD protection device in a semiconductor substrate, comprising:

first and second heavily doped active areas as a source and a drain of a lateral CMOS transistor;

a third heavily doped area separated from the first active area;

a first well resistor between and at least partially under the first active area and the heavily doped third area and conductively coupled thereto, the first well resistor having a higher sheet resistance than the first active area and the third area;

a first conductive layer disposed over the third area and electrically coupled thereto;

a fourth heavily doped area separated from the second active area;

a second well resistor formed between and at least partially under the second active area and the fourth heavily doped area and conductively coupled thereto, the second well resistor having a higher sheet resistance than the second active area and the fourth area;

a second conductive layer disposed over the fourth area and conductively coupled thereto; and a first insulative layer disposed between the third heavily doped area and the first conductive layer, wherein the first and second active areas and the third and fourth heavily doped areas are silicided so as to lower their resistance by a substantial factor.

24. The ESD protection structure of claim 23 wherein the well resistors are doped with n type donor impurities.

25. The ESD protection structure of claim 23 wherein the well resistors are doped with p type donor impurities.

26. An ESD protection device in a semiconductor substrate, comprising:

first and second heavily doped active areas as a source and a drain of a lateral CMOS transistor;

a third heavily doped area separated from the first active area;

a first well resistor between and at least partially under the first active area and the heavily doped third area and conductively coupled thereto, the first well resistor having a higher sheet resistance than the first active area and the third area;

a first conductive layer disposed over the third area and electrically coupled thereto;

a fourth heavily doped area separated from the second active area;

a second well resistor formed between and at least partially under the second active area and the fourth heavily doped area and conductively coupled thereto, the second well resistor having a higher sheet resistance than the second active area and the fourth area; and a second conductive layer disposed over the fourth area and conductively coupled thereto;

wherein the first and second active areas and the third and fourth heavily doped areas are silicided so as to lower their resistance by a substantial factor, and wherein the transistor, the first well resistor, and the second well resistor are disposed substantially in a straight line with each other.

27. The ESD protection structure of claim 26 wherein the well resistors are doped with n type donor impurities.

28. The ESD protection structure of claim 26 wherein the well resistors are doped with p type donor impurities.

* * * * *

UNITED STATES PATENT AND TRADEMARK OFFICE
CERTIFICATE OF CORRECTION

PATENT NO. : 6,507,074 B2
DATED : January 14, 2003
INVENTOR(S) : Stephen L. Casper, Manny K.F. Ma and Joseph C. Sher It is certified that error appears in the above-identified patent and that said Letters Patent is hereby corrected as shown below:

Title page,
Item [56], FOREIGN PATENT DOCUMENTS, insert the following under
"GB    2281813":
-- JP    9-36357 --
Item [57], ABSTRACT,
Line 2, insert -- . -- after "transistor".

Column 1,
Line 12, delete "ceding" before "application" and insert -- copending -- therefor.
Line 13, delete "tided." and insert -- titled: -- therefor.
Line 44, delete "transistor" after "ESD" and insert -- transistors -- therefor.
Line 58, delete "tiles" before "greater" and insert -- times -- therefor.
Line 61, delete "tie" before "n+" and insert -- the --, therefor.

Column 3,
Line 26, delete "tie" after "same" and insert -- time -- therefor.
Line 51, insert -- the -- before -- n+ --.

Column 4,
Line 10, delete "embodiment" and insert -- embodiments -- therefor.
Line 13, insert -- , -- after "claims".
Line 58, delete "2" after "claim" and insert -- 1 -- therefor.

Signed and Sealed this

Twenty-sixth Day of August, 2003

JAMES E. ROGAN
*Director of the United States Patent and Trademark Office*